(12) United States Patent
Stamper

(10) Patent No.: US 7,858,270 B2
(45) Date of Patent: Dec. 28, 2010

(54) METHOD FOR ETCHING USING A MULTI-LAYER MASK

(75) Inventor: Harlan Stamper, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 452 days.

(21) Appl. No.: 11/751,086

(22) Filed: May 21, 2007

(65) Prior Publication Data

US 2008/0292973 A1 Nov. 27, 2008

(51) Int. Cl.
*G03F 1/00* (2006.01)
(52) U.S. Cl. ......................................... 430/5
(58) Field of Classification Search ............... 430/5, 430/322; 438/638; 716/21; 216/41
See application file for complete search history.

(56) References Cited

U.S. PATENT DOCUMENTS

| | | | |
|---|---|---|---|
| 2002/0151179 A1* | 10/2002 | Juengling | 438/701 |
| 2004/0069745 A1* | 4/2004 | Ho et al. | 216/41 |
| 2004/0097077 A1* | 5/2004 | Nallan et al. | 438/689 |
| 2005/0003675 A1* | 1/2005 | Carducci et al. | 438/710 |
| 2006/0258116 A1* | 11/2006 | Kim et al. | 438/424 |
| 2007/0010099 A1* | 1/2007 | Du et al. | 438/706 |

* cited by examiner

*Primary Examiner*—Stephen Rosasco
*Assistant Examiner*—Rashid Alam

(57) ABSTRACT

A method of dry developing a multi-layer mask on a substrate is described. The method comprises forming the multi-layer mask on the substrate, wherein the multi-layer mask comprises a lithographic layer overlying a second mask layer. A feature pattern is then formed in the lithographic layer using a lithographic process, wherein the feature pattern comprises a first critical dimension (CD). Thereafter, the feature pattern is transferred from the lithographic layer to the second mask layer using a dry plasma etching process, wherein the dry plasma etching process comprises introducing a process gas, forming plasma from the process gas, and exposing the substrate to the plasma. During the pattern transfer, the first CD in the lithographic layer is reduced to a second CD in the silicon-containing layer.

15 Claims, 10 Drawing Sheets

METHOD FOR ETCHING USING A MULTI-LAYER MASK

BACKGROUND OF THE INVENTION

1. Field of the Invention

The present invention relates to a method for etching a feature in a substrate, and more particularly to a method for etching a feature in a substrate using a multi-layer mask.

2. Description of Related Art

Typically, during fabrication of integrated circuits (ICs), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while substantially not etching another material. For example, on a semiconductor substrate, a pattern formed in a protective layer can be transferred to an underlying layer of a selected material utilizing a plasma etching process. The protective layer can comprise a light-sensitive layer, such as a photoresist layer, having a pattern formed using a lithographic process. Once the pattern is formed, the semiconductor substrate is disposed within a plasma processing chamber, and an etching chemistry is formed that selectively etches the underlying layer while minimally etching the protective layer. This etch chemistry is produced by introducing an ionizable, dissociative gas mixture having parent molecules comprising molecular constituents capable of reacting with the underlying layer while minimally reacting with the protective layer. The production of the etch chemistry comprises introduction of the gas mixture and formation of plasma when a portion of the gas species present are ionized following a collision with an energetic electron. Moreover, the heated electrons serve to dissociate some species of the gas mixture and create a reactive mixture of chemical constituents (of the parent molecules). Thereafter, the ionized gas species and reactive mixture of chemical constituents facilitate the etching of various features (e.g., trenches, vias, contacts, etc.) in the exposed regions of substrate. Such substrate materials where etching is required include silicon dioxide ($SiO_2$), low dielectric constant (low-k) materials, ultra-low-k materials, polycrystalline silicon, silicon and silicon nitride, for example.

SUMMARY OF THE INVENTION

The present invention relates to a method for etching a feature in a substrate.

Additionally, a method for etching a feature in a substrate using a multi-layer mask is provided. Furthermore, during the dry development of the multi-layer mask, a critical dimension of the feature formed in an upper layer of the multi-layer mask is reduced to a second critical dimension of the feature formed in an underlying layer of the multi-layer mask.

According to one embodiment, a method of dry developing a multi-layer mask on a substrate is described, comprising: disposing the substrate comprising the multi-layer mask in a plasma processing system, wherein the multi-layer mask comprises a lithographic layer overlying a second mask layer and wherein the lithographic layer comprises a feature pattern formed therein using a lithographic process, the feature pattern having a first critical dimension (CD); establishing a process recipe configured to cause a deposition condition on the sidewalls of the feature pattern as the feature pattern is transferred to the second mask layer, wherein the deposition condition is configured to cause a reduction from the first CD in the lithographic layer to a second CD in the second mask layer introducing a process gas to the plasma processing system according to the process recipe; forming plasma from the process gas in the plasma processing system according to the process recipe; and exposing the substrate to the plasma in order to transfer the feature pattern in the lithographic layer to the underlying second mask layer.

According to another embodiment, a method of dry developing a multi-layer mask on a substrate is described. The method comprises forming the multi-layer mask on the substrate, wherein the multi-layer mask comprises a lithographic layer overlying a second mask layer. A feature pattern is then formed in the lithographic layer using a lithographic process, wherein the feature pattern comprises a first critical dimension (CD). Thereafter, the feature pattern is transferred from the lithographic layer to the second mask layer using a dry plasma etching process, wherein the dry plasma etching process comprises introducing a process gas, forming plasma from the process gas, and exposing the substrate to the plasma. During the pattern transfer, the first CD in the lithographic layer is reduced to a second CD in the silicon-containing layer.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

In material processing methodologies, plasma is often utilized to create and assist surface chemistry on a substrate to facilitate the removal of material from the substrate or to facilitate film forming reactions for depositing material on the substrate. During the etching of a substrate, plasma may be utilized to create reactive chemical species that are suitable for reacting with the certain materials on the surface of a substrate. Furthermore, during the etching of a substrate, plasma may be utilized to create charged species that are useful for delivering energy to surface reactions on the substrate.

According to one example, pattern etching comprises the application of a lithographic layer, such as a thin layer of light-sensitive material (e.g., photoresist), to an upper surface of a substrate that is subsequently patterned in order to provide a mask for transferring this pattern to the underlying thin film on the substrate during etching. The patterning of the light-sensitive material generally involves exposure of the lithographic layer to a geometric pattern of electromagnetic (EM) radiation using, for example, a micro-lithography system, followed by the removal of the irradiated regions of the light-sensitive material (as in the case of positive photo-resist), or non-irradiated regions (as in the case of negative resist) using a developing solvent.

In order to pattern thinner features in the lithographic layer using conventional lithography techniques, multi-layer masks can be implemented. For example, the multi-layer mask may include a bilayer mask or trilayer mask. With the inclusion of a second or third layer, the uppermost lithographic layer may be thinner than the thickness customarily chosen to withstand the subsequent dry etching process(es) and, therefore, using conventional lithography techniques, finer features may be formed in the thinner lithographic layer. Thereafter, the finer feature formed in the lithographic layer may be transferred to the underlying second or third layers using a dry development process, such as a dry etching process. However, there still exists a need to produce even finer features in the multi-layer mask.

Figure 1A:
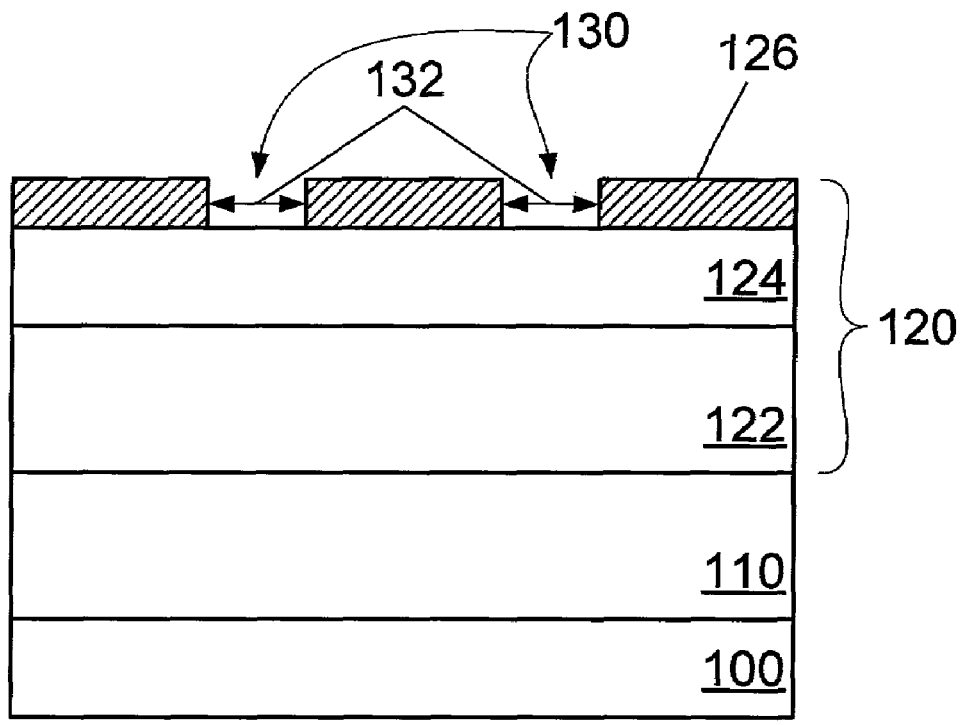
FIGS. 1A through 1D illustrate a schematic representation of a procedure for etching a feature in a substrate according to an embodiment.
Figure 1B:
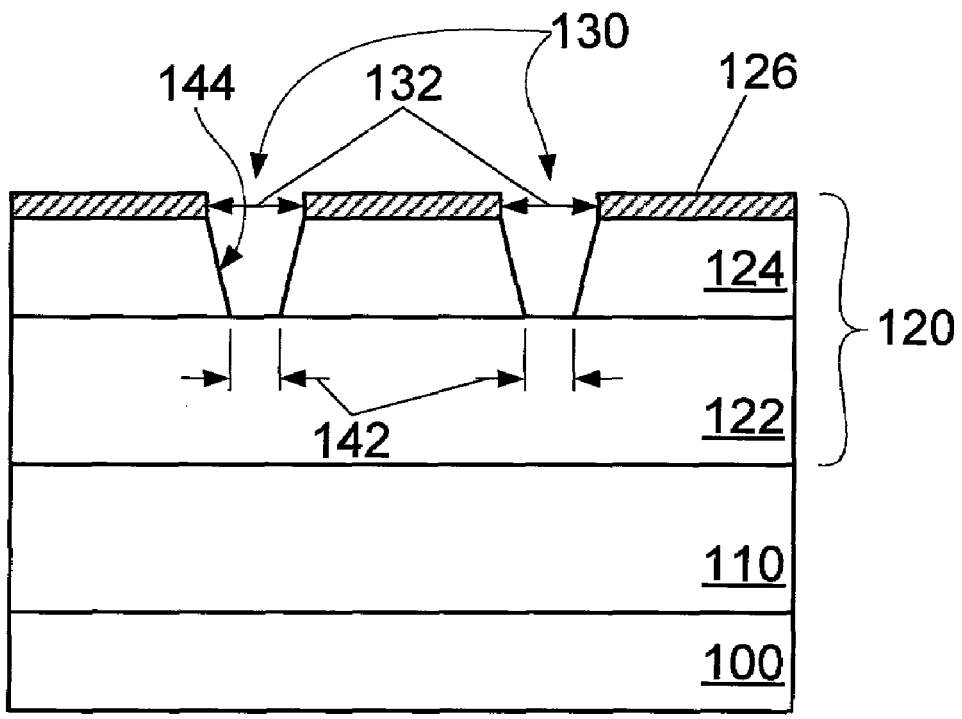
Figure 1C:
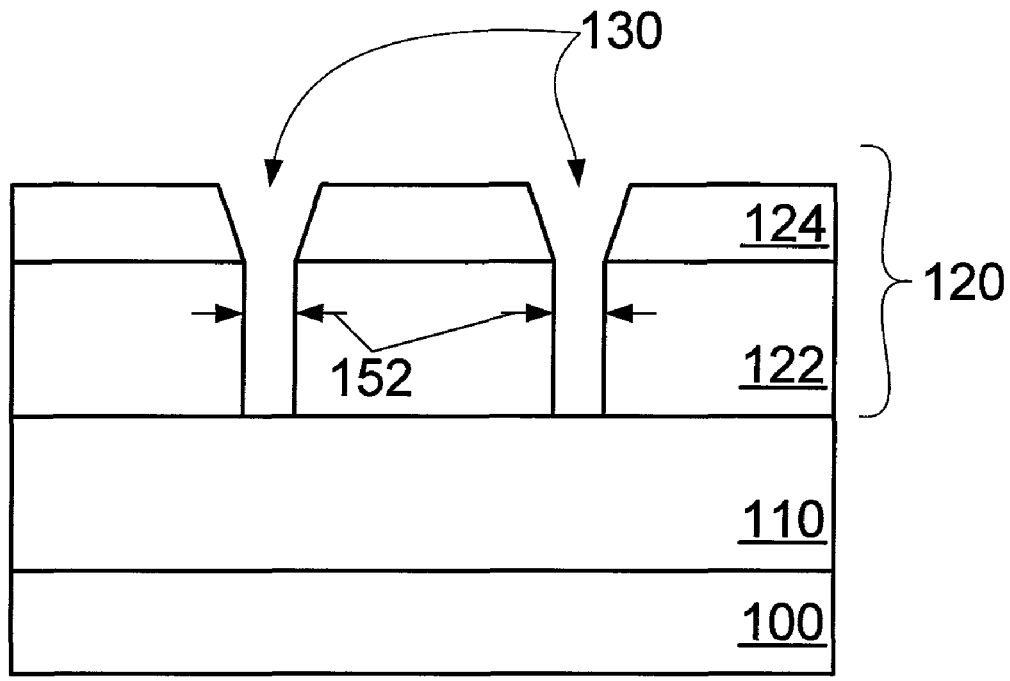
Figure 1D:
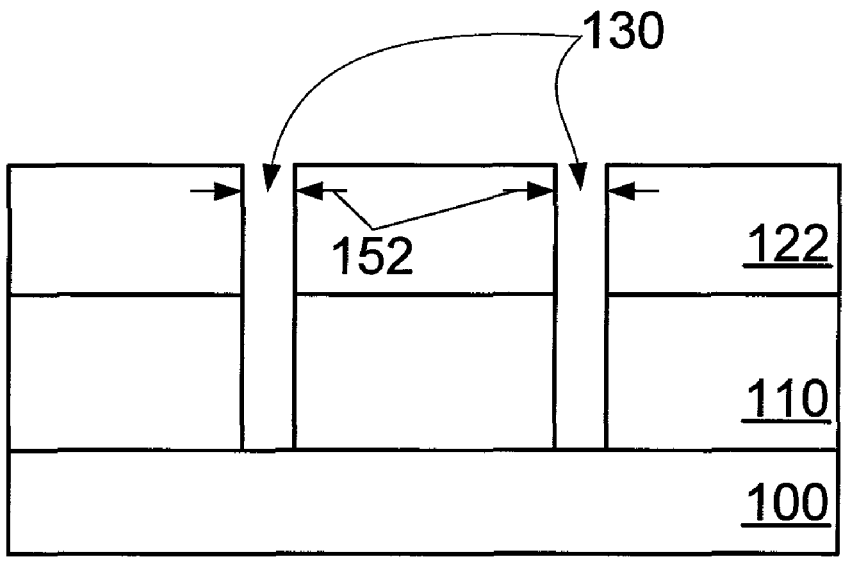
Figure 2:
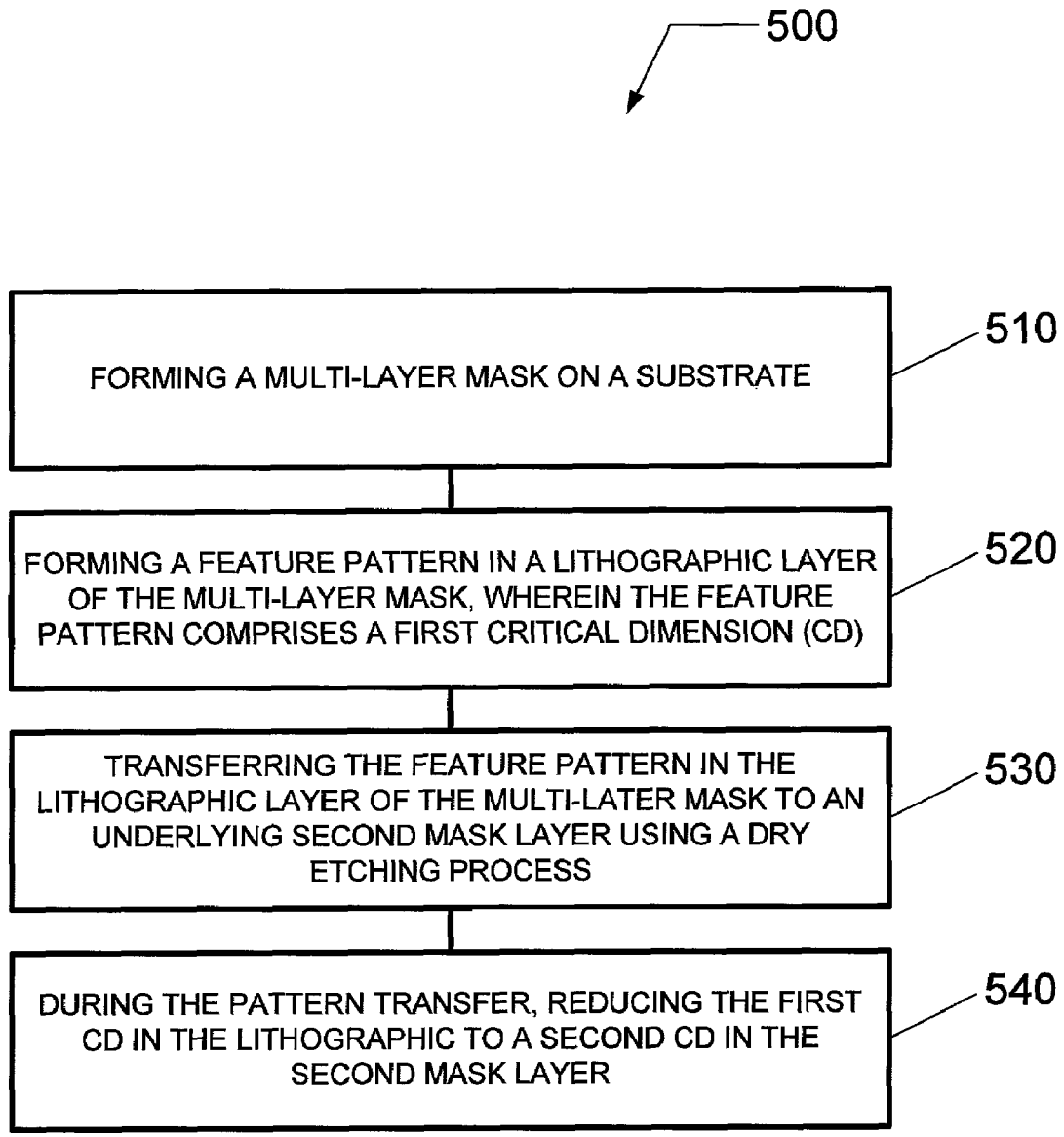
FIG. 2 provides a flow chart illustrating a method of etching a feature in a substrate according to an embodiment.

Therefore, according to an embodiment, a method of etching a feature in a substrate is schematically illustrated in FIGS. 1A through 1D, and is illustrated in a flow chart 500 in FIG. 2. The method begins in 510 with forming a multi-layer mask 120 on a thin film 110, to which a pattern is to be transferred, upon substrate 100. The multi-layer mask 120 comprises a lithographic layer 126, a second mask layer 124 and an optional third mask layer 122.

The substrate 100 may comprise a semiconductor substrate, a wafer, a flat panel display or a liquid crystal display.

The thin film 110 may comprise a conductive layer, a non-conductive layer, or a semi-conductive layer. For instance, the thin film 110 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, or silicon oxynitride, etc. Additionally, for instance, the thin film 110 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 110 may have a dielectric constant of less than 3.7, or a dielectric constant ranging from 1.6 to 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc. Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process. Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3™ semiconductor dielectric resins commercially available from Honeywell.

The thin film 110 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The lithographic layer 126 may comprise a layer of light-sensitive material, such as photoresist. The photoresist layer may comprise 248 nm (nanometer) resists, 193 nm resists, 157 nm resists, or EUV (extreme ultraviolet) resists. The photoresist layer can be formed using a track system. For example, the track system can comprise a Clean Track ACT 8, ACT 12, or Lithius resist coating and developing system commercially available from Tokyo Electron Limited (TEL). Other systems and methods for forming a photoresist layer on a substrate are well known to those skilled in the art of spin-on resist technology.

The second mask layer 124 can comprise a silicon-containing layer, such as a silicon-containing anti-reflective coating (ARC) layer. For example, the second mask layer 124 may comprise a silicon-containing ARC commercially available as Sepr-Shb Aseries SiARC from Shin Etsu Chemical Co., Ltd. The second mask layer 124 may, for example, be applied using spin coating technology, or a vapor deposition process.

The optional third mask layer 122 may comprise an inorganic layer or an organic layer. For example, the optional third mask layer 122 may comprise an organic planarization layer (OPL). The OPL can include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

In 520 and as shown in FIG. 1A, the lithographic layer 126 is imaged with an image pattern. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Thereafter, the image pattern is developed in the lithographic layer 126 to form feature pattern 130 having a first critical dimension (CD) 132. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

In 530 and as shown in FIG. 1B, the feature pattern 130 is transferred from the lithographic layer 126 to the second mask layer 124, such as a silicon-containing layer, using a dry plasma etching process. The dry plasma etching process comprises introducing a process gas to the plasma processing system according to a process recipe, forming plasma from the process gas in the plasma processing system according to the process recipe, and exposing the substrate to the plasma.

For example, when the second mask layer 124 comprises a silicon-containing layer, the dry plasma etching process can comprise introducing a process gas comprising a fluorocarbon gas and a hydrofluorocarbon gas, forming plasma from the process gas, and exposing the substrate to the plasma.

The fluorocarbon gas may include any gas containing carbon (C) and fluorine (F), such as those chemical compositions represented as $C_xF_y$, where x and y are integers greater than or equal to unity. For example, the fluorocarbon gas may include $CF_4$, $C_3F_6$, $C_4F_6$, $C_4F_8$, or $C_5F_8$, or a combination of two or more thereof. The hydrofluorocarbon gas may include any gas containing carbon (C), fluorine (F) and hydrogen (H), such as those chemical compositions represented as $C_xF_yH_z$, where x, y and z are integers greater than or equal to unity. For example, the hydrofluorocarbon gas may include introducing trifluoromethane ($CHF_3$), or difluoromethane ($CH_2F_2$), or both. The process gas may further comprise a dilution gas, or carrier gas. For example, the process gas may further comprise an inert gas, such as a noble gas.

In 540 and also as shown in FIG. 1B, during the pattern transfer, the first CD 132 for the feature pattern 130 in the lithographic layer 126 is reduced to a second CD 142 in the second mask layer 124. When forming plasma from the process gas, a process recipe is selected to cause a reduction from the first CD 132 in the lithographic layer 126 to the second CD 142 in the second mask layer 124. For example, the process condition can include: (1) selecting a ratio between an amount of the fluorocarbon gas and an amount of the hydrofluorocarbon gas that causes a deposition condition on the sidewall 144 of the feature pattern 130 as the feature pattern 130 is transferred to the second mask layer 124; and (2) selecting an etch time to adjust the amount of reduction in CD between the first CD 132 and the second CD 142.

When dry plasma etching a silicon-containing layer, the inventor has observed that, among other parameters, the ratio between the amount of the fluorocarbon gas and the amount of the hydrofluorocarbon gas can affect a deposition condition on the sidewall 144 of the feature pattern 130 being formed in the second mask layer 124 during the etching process. The amount of deposition on the sidewall 144 affects the amount of reduction in CD between the first CD 132 in the lithographic layer 126 and the second CD 142 in the second mask layer 124 once the feature pattern 130 is etched through the thickness of the second mask layer 124. Although a deposition condition is produced, the etching process proceeds through the thickness of F the second mask layer since the bottom surface of the feature pattern being formed in the second mask layer is substantially perpendicular the ion flux at the substrate and, thus, receives a relatively high ion flux. Moreover, the deposition on the sidewall 144 protects the sidewall from plasma chemistry and ion bombardment while etching through the second mask layer 124 proceeds.

Once the feature pattern 130 extends through the thickness of the second mask layer 124, the etch time may be extended in order to reduce the amount of difference between the first CD 132 and the second CD 142. By extending the etch time, the inventor has observed that the plasma chemistry and ion bombardment can enlarge the second CD 142 towards the original, first CD 132.

As shown in FIG. 1C, the feature pattern 130 having second CD 142 formed in the second mask layer 124 can be transferred to the underlying optional third mask layer 122 to form a third CD 152 in the third mask layer 122 using one or more etching processes. The third CD 152 can be substantially the same as the second CD 142, or it may be different. For example, the one or more etching processes may include any combination of wet or dry etching processes. The dry etching processes may include dry plasma etching processes or dry non-plasma etching processes.

As shown in FIG. 1D, the feature pattern 130 having third CD 152 formed in the optional third mask layer 122 can be transferred to the underlying thin film 110 using one or more etching processes. For example, the one or more etching processes may include any combination of wet or dry etching processes. The dry etching processes may include dry plasma etching processes or dry non-plasma etching processes.

Figure 3:
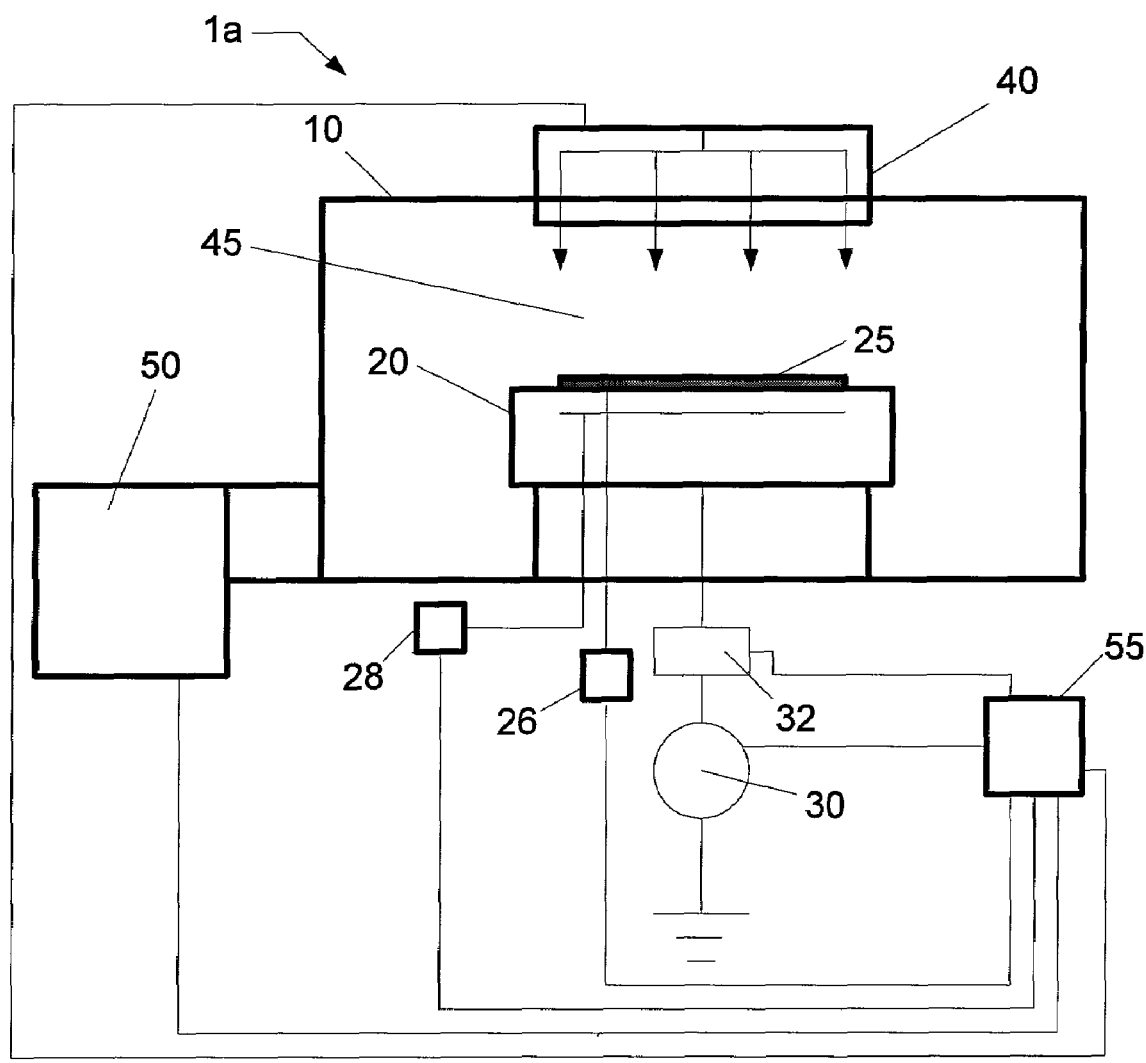
FIG. 3 shows a schematic representation of a processing system according to an embodiment.

According to one embodiment, a processing system 1a configured to perform the above identified process conditions is depicted in FIG. 3 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermoelectric heaters/coolers can be included in the substrate holder 20, as well as the chamber wall of the plasma processing chamber 10 and any other component within the processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 3, substrate holder 20 can comprise an electrode through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma processing system 1a according to a process recipe in order to perform a plasma assisted process on substrate 25. One example of controller 55 is a DELL PRECISION WORKSTATION 610™, available from Dell Corporation, Austin, Tex.

Controller 55 can be locally located relative to the processing system 1a, or it can be remotely located relative to the processing system 1a. For example, controller 55 can exchange data with processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 4, processing system 1b can be similar to the embodiment of FIG. 3 and further comprise either a stationary, or mechanically or electrically rotating magnetic field system 60, in order to potentially increase plasma density and/or improve plasma processing uniformity, in addition to those components described with reference to FIG. 3. Moreover, controller 55 can be coupled to magnetic field system 60 in order to regulate the speed of rotation and field strength. The design and implementation of a rotating magnetic field is well known to those skilled in the art.

Figure 4:
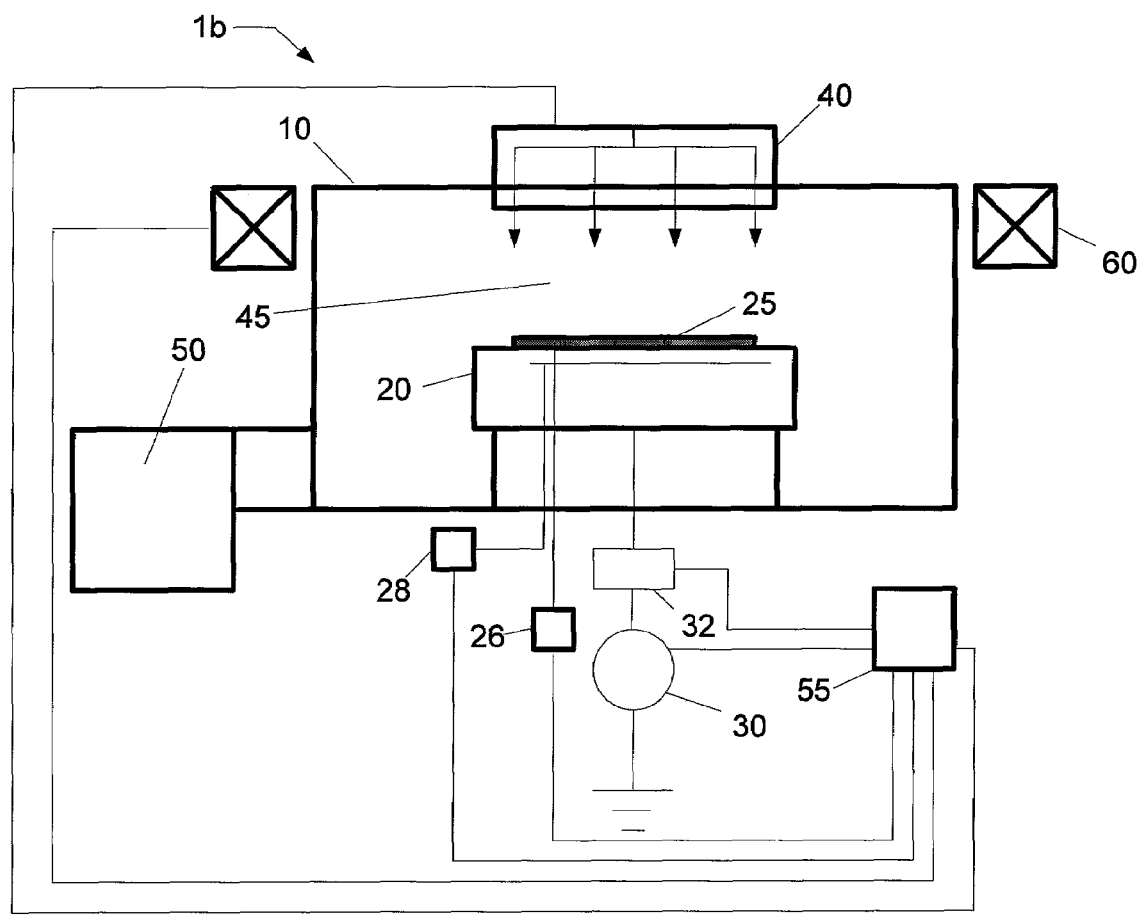
FIG. 4 shows a schematic representation of a processing system according to another embodiment.
Figure 5:
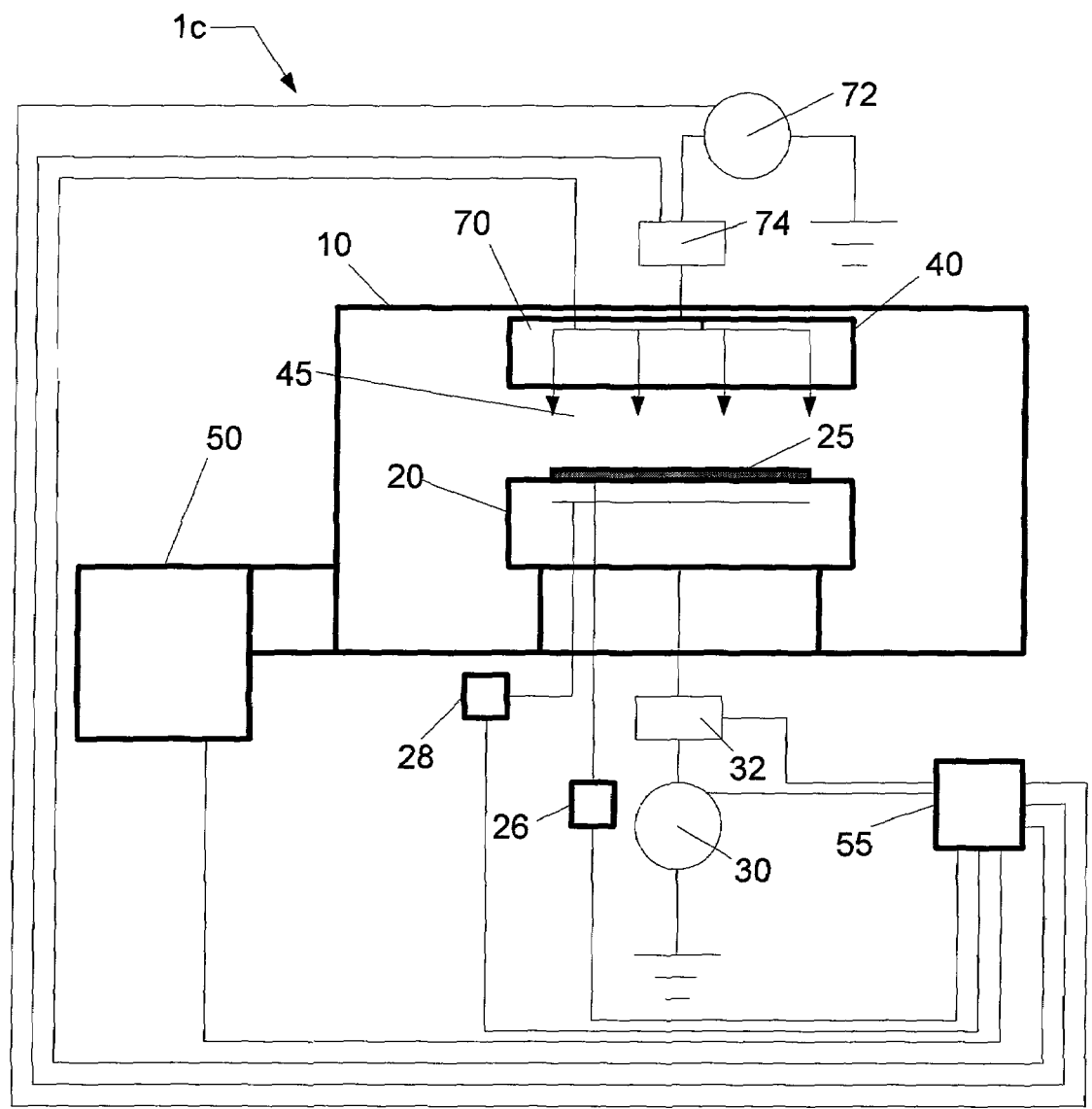
FIG. 5 shows a schematic representation of a processing system according to another embodiment.

In the embodiment shown in FIG. 5, processing system 1c can be similar to the embodiment of FIG. 3 or FIG. 4, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 6:
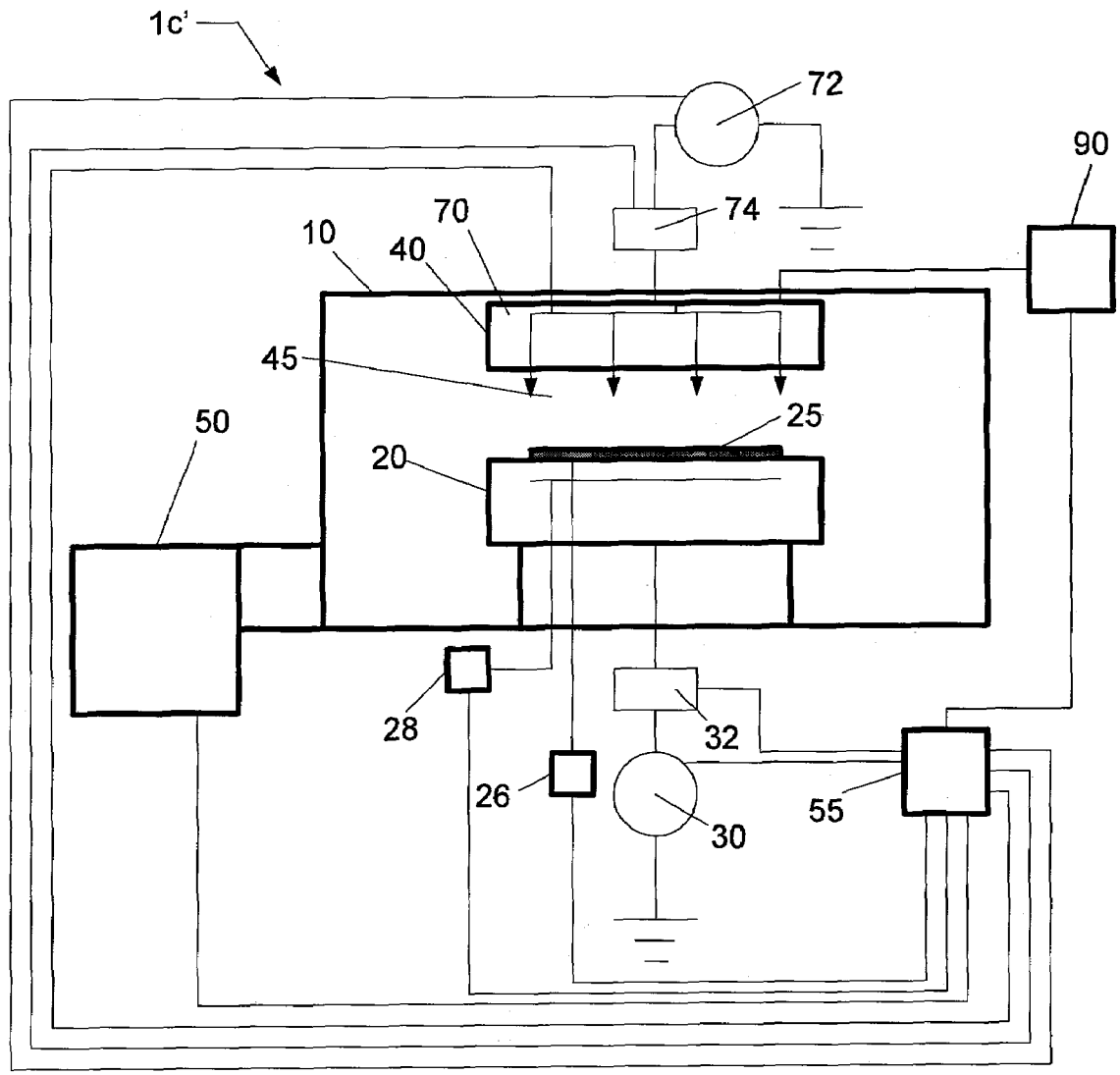
FIG. 6 shows a schematic representation of a processing system according to another embodiment.

In the embodiment shown in FIG. 6, processing system 1c' can be similar to the embodiment of FIG. 5, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring adjusting, or controlling the polarity, current, voltage, or on/off state of the DC power supply 90. Once plasma is formed, the DC power supply 90 facilitates the formation of a ballistic electron beam. An electrical filter may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 7:
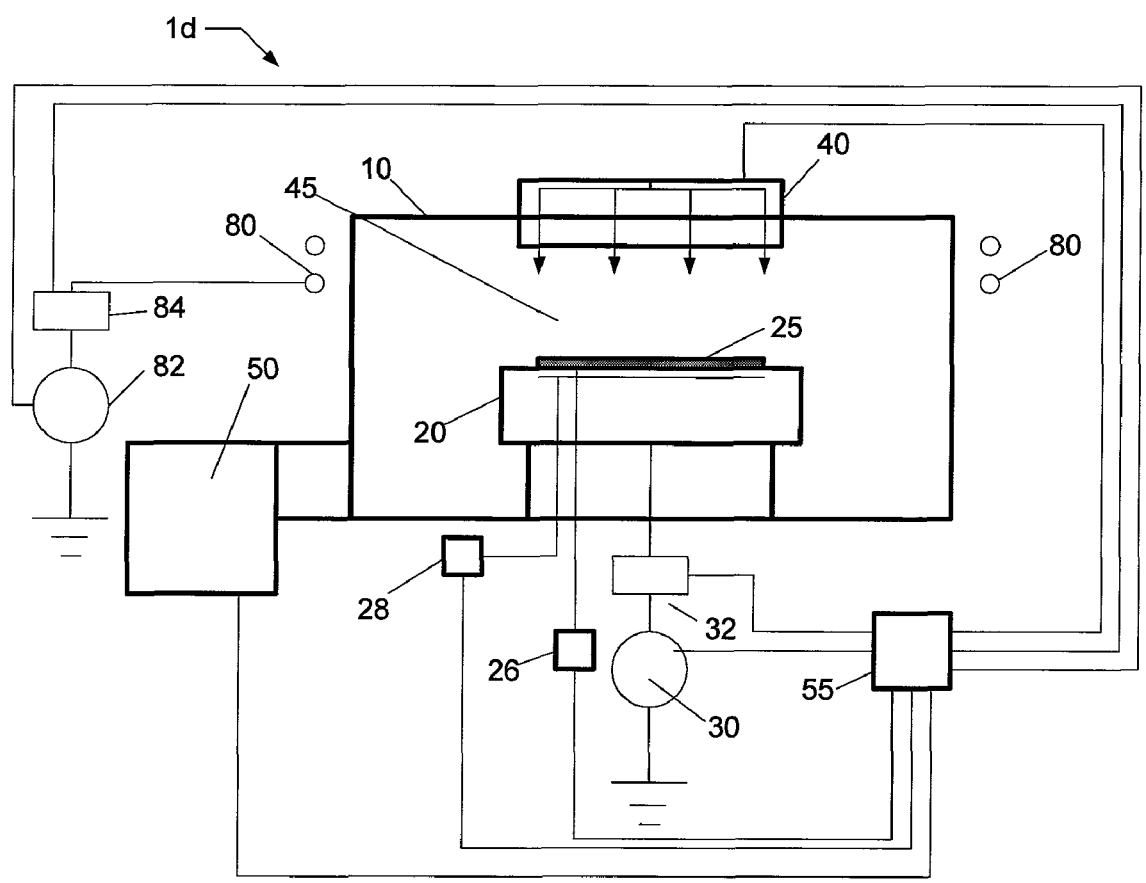
FIG. 7 shows a schematic representation of a processing system according to another embodiment.

In the embodiment shown in FIG. 7, the processing system 1*d* can be similar to the embodiments of FIGS. 3 and 4, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 8:
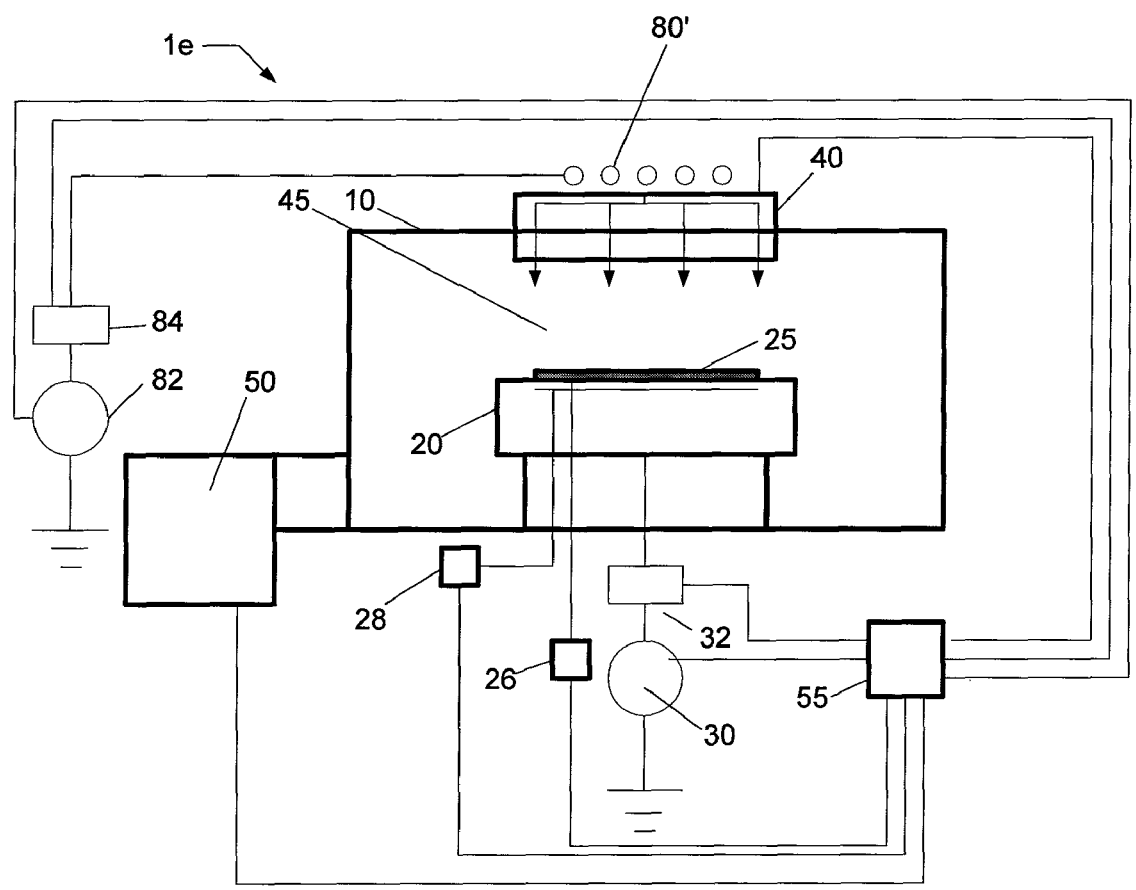
FIG. 8 shows a schematic representation of a processing system according to another embodiment.

In an alternate embodiment, as shown in FIG. 8, the processing system 1*e* can be similar to the embodiment of FIG. 7, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 9:
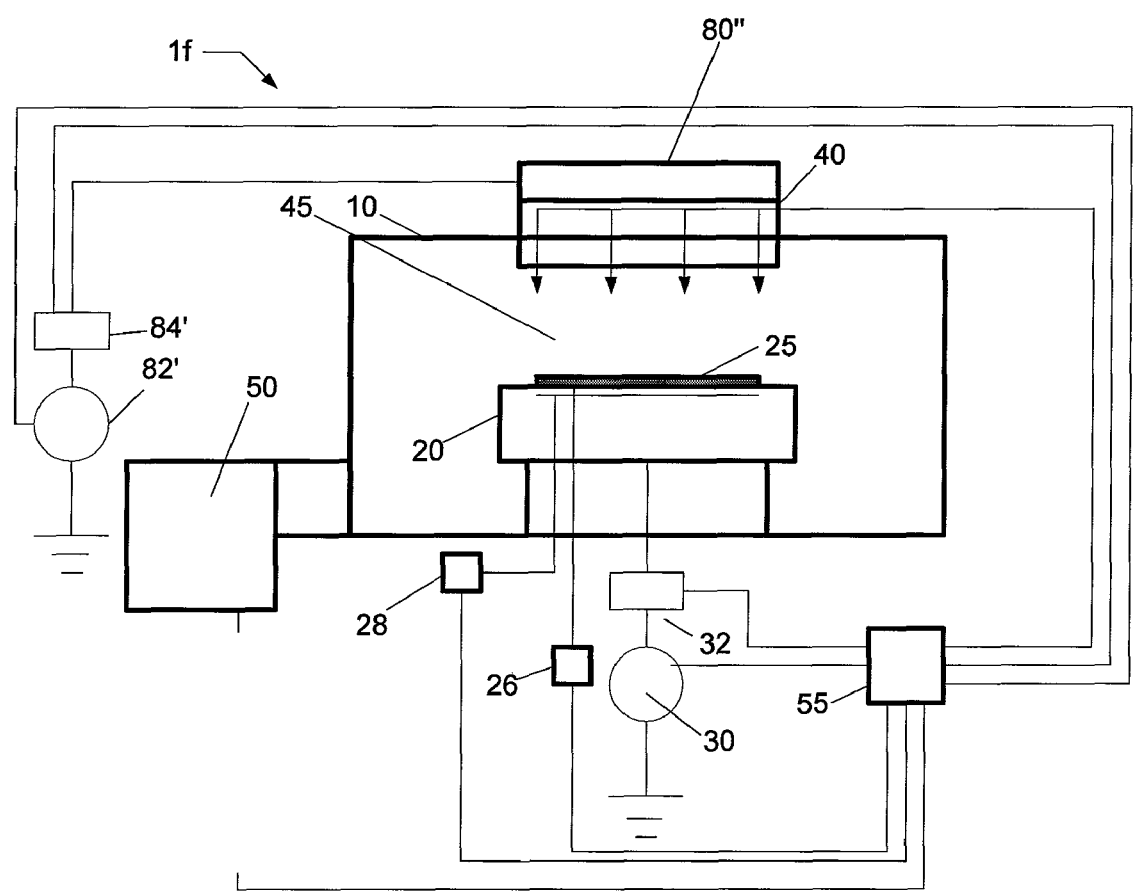
FIG. 9 shows a schematic representation of a processing system according to another embodiment.

In the embodiment shown in FIG. 9, the processing system 1*f* can be similar to the embodiments of FIGS. 3 and 4, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

In the following discussion, a method of etching a feature in a multi-layer mask on a substrate utilizing a dry plasma etching system is presented. For example, the dry plasma etching system can comprise various elements, such as described in FIGS. 3 through 9, and combinations thereof. Furthermore, for example, the multi-layer mask can comprise a patterned multi-layer mask overlying a second mask layer, such as a silicon-containing ARC layer.

In one embodiment, a method of etching a feature pattern in a second mask layer while reducing the CD from a first CD formed in a lithographic layer to a second CD formed in the second mask layer, comprises a process chemistry having a fluorocarbon gas, such as $CF_4$, and a hydrofluorocarbon gas, such as trifluoromethane ($CHF_3$), and optionally an inert gas, such as argon (Ar). For example, a process parameter space can comprise a chamber pressure of about 5 to about 1000 mTorr, a fluorocarbon process gas flow rate ranging from about 1 to about 1000 sccm, a hydrofluorocarbon process gas flow rate ranging from about 1 to about 1000 sccm, an optional Ar process gas flow rate ranging from about 1 sccm to about 2000 sccm, an upper electrode (e.g., element 70 in FIG. 6) RF bias ranging from about 0 to about 2000 W, an upper electrode DC voltage ranging from about −200 V to about −2500 V, and a lower electrode (e.g., element 20 in FIG. 6) RF bias ranging from about 10 to about 1000 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

As described earlier, a deposition condition can be created by adjusting the amount of fluorocarbon gas relative to the amount of hydrofluorocarbon gas. For example, an amount can be characterized as a flow rate, a volume flow rate, a mass, a mass flow rate, a mass fraction, a number of moles, a molar flow rate, a mole fraction, a concentration, a partial pressure, etc. The ratio between the amount of fluorocarbon gas and the amount of hydrofluorocarbon gas can range from approximately a value of 1.5 to approximately a value of 5. Alternatively, the ratio between the amount of fluorocarbon gas and the amount of hydrofluorocarbon gas can range from approximately a value of 2 to approximately a value of 3. Alternatively yet, the ratio between the amount of fluorocarbon gas and the amount of hydrofluorocarbon gas can be equivalent to approximately a value of 2.5.

Additionally, as described earlier for a process condition producing a deposition condition, the etch time can be adjusted to alter the amount of reduction in CD from the first CD in the lithographic layer to the second CD in the second mask layer. With knowledge of the etch rate for the etch process and the thickness of the second mask layer, an approximate nominal etch time can be determined for extending the feature pattern through the thickness of the second mask layer. Thereafter, the nominal etch time can be extended to etch back the sidewalls towards a straight-wall condition and reduce the difference between the first CD in the lithographic layer and the second CD in the second mask layer, if desired. The etch time can range from about 10 seconds to about 240 seconds. Alternatively, the etch time can range from about 60 seconds to about 100 seconds. Alternatively yet, the etch time can be approximately 80 seconds for a second mask layer having a thickness of approximately 80 nm thick. Alternatively yet, the etch time can include a nominal etch time (e.g., the ratio of the layer thickness to the approximate etch rate) and an extension of the etch time that ranges from approximately 0% the nominal etch time to approximately 200% of the nominal etch time. Alternatively yet, the extension of the etch time can range from approximately 0% the nominal etch time to approximately 50% the nominal etch time.

In one example, a method of etching a feature pattern in a silicon-containing ARC layer while reducing the CD from a first CD formed in the lithographic layer to a second CD formed in the silicon-containing layer, comprises a process chemistry having $CF_4$ and trifluoromethane ($CHF_3$). The ratio between an amount of $CF_4$ and $CHF_3$ can have a value of approximately 2.5. A process parameter space can comprise a chamber pressure of about 100 mTorr, a f $CF_4$ process gas flow rate of about 75 sccm, a $CHF_3$ process gas flow rate of about 30 sccm, an upper electrode (e.g., element 70 in FIG. 6) RF bias of about 500 W, an upper electrode DC voltage of about −500 V, and a lower electrode (e.g., element 20 in FIG. 6) RF bias of about 400 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz. The etch time can be approximately 80 seconds for an approximately 217 nm thick silicon-containing layer, wherein the first CD of about 80 nm is reduced to a second CD (of about 30 nm) by about 50 nm.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of dry developing a multi-layer mask on a substrate, comprising:
   disposing said substrate comprising said multi-layer mask in a plasma processing system, wherein said multi-layer mask comprises a lithographic layer overlying a second mask layer and wherein said lithographic layer comprises a feature pattern formed therein using a lithographic process, said feature pattern having a first critical dimension (CD);
   establishing a process recipe configured to cause a deposition condition on the sidewalls of said feature pattern as said feature pattern is transferred to said second mask layer, wherein said deposition condition is configured to cause a reduction from said first CD in said lithographic layer to a second CD in said second mask layer;
   introducing a process gas to said plasma processing system according to said process recipe, wherein said process gas comprises a fluorocarbon gas and a hydrofluorocarbon gas;
   forming plasma from said process gas in said plasma processing system according to said process recipe; and
   exposing said substrate to said plasma in order to transfer said feature pattern in said lithographic layer to said underlying second mask layer,
   wherein said lithographic layer comprises a light-sensitive layer, and said second mask layer comprises a silicon-containing anti-reflective coating (ARC) layer,
   wherein said process recipe comprises a ratio between an amount of said fluorocarbon gas and an amount of said hydrofluorocarbon gas, and an etch time, and
   wherein said ratio between an amount of said fluorocarbon gas and an amount of said hydrofluorocarbon gas ranges from approximately 1.5 to approximately 5.

2. The method of claim 1, wherein said introducing said process gas further comprises introducing a noble gas.

3. The method of claim 1, wherein said introducing said fluorocarbon gas comprises introducing $CF_4$, $C_3F_6$, $C_4F_6$, $C_4F_8$, or $C_5F_8$, or a combination of two or more thereof.

4. The method of claim 1, wherein said introducing said hydrofluorocarbon gas comprises introducing trifluoromethane ($CHF_3$), or difluoromethane ($CH_2F_2$), or both.

5. The method of claim 1, wherein said process gas comprises $CF_4$ and $CHF_3$.

6. The method of claim 1, wherein said ratio between an amount of said fluorocarbon gas and an amount of said hydrofluorocarbon gas ranges from approximately 2 to approximately 3.

7. The method of claim 1, wherein said ratio between an amount of said fluorocarbon gas and an amount of said hydrofluorocarbon gas is approximately 2.5.

8. The method of claim 1, wherein said etch time ranges from approximately 10 seconds to approximately 240.

9. The method of claim 1, wherein said etch time ranges from approximately 60 seconds to approximately 100 seconds.

10. A computer readable medium containing program instructions for execution on a computer system, which when executed by the computer system, cause the computer system to perform the steps of:
    disposing a substrate comprising a multi-layer mask in a plasma processing system, wherein said multi-layer mask comprises a lithographic layer overlying a second mask layer and wherein said lithographic layer comprises a feature pattern formed therein using a lithographic process, said feature pattern having a first critical dimension (CD);
    establishing a process recipe configured to cause a deposition condition on the sidewalls of said feature pattern as said feature pattern is transferred to said second mask layer, wherein said deposition condition is configured to cause a reduction from said first CD in said lithographic layer to a second CD in said second mask layer;
    introducing a process gas to said plasma processing system according to said process recipe, wherein said process gas comprises a fluorocarbon gas and a hydrofluorocarbon gas;
    forming plasma from said process gas in said plasma processing system according to said process recipe; and
    exposing said substrate to said plasma in order to transfer said feature pattern in said lithographic layer to said underlying second mask layer,
    wherein said lithographic layer comprises a light-sensitive layer, and said second mask layer comprises a silicon-containing anti-reflective coating (ARC) layer,
    wherein said process recipe comprises a ratio between an amount of said fluorocarbon gas and an amount of said hydrofluorocarbon gas, and an etch time, and
    wherein said ratio between an amount of said fluorocarbon gas and an amount of said hydrofluorocarbon gas ranges from approximately 1.5 to approximately 5.

11. A method of dry developing a multi-layer mask on a substrate, comprising:
    forming said multi-layer mask on said substrate, wherein said multi-layer mask comprises a lithographic layer overlying a second mask layer;
    forming a feature pattern in said lithographic layer using a lithographic process, wherein said feature pattern comprises a first critical dimension (CD);
    transferring said feature pattern from said lithographic layer to said second mask layer using a dry plasma etching process, wherein said dry plasma etching process comprises introducing a process gas, forming plasma from said process gas, and exposing said substrate to said plasma, wherein said process gas comprises a fluorocarbon gas and a hydrofluorocarbon gas;
    selecting a ratio between an amount of said fluorocarbon gas and an amount of said hydrofluorocarbon gas that causes a deposition condition on the sidewall of said feature pattern as said feature pattern is transferred to said silicon-containing layer;
    selecting an etch time to adjust the amount of reduction in CD between said first CD and said second CD; and
    during said transferring, reducing said first CD in said lithographic layer to a second CD in said silicon-containing layer,
    wherein said second mask layer comprises a silicon-containing anti-reflective coating (ARC) layer, and
    wherein said ratio between an amount of said fluorocarbon gas and an amount of said hydrofluorocarbon gas ranges from approximately 1.5 to approximately 5.

12. The method of claim 7, further comprising:
    forming an organic layer between said multi-layer mask and said substrate; and
    transferring said feature pattern with said second CD in said silicon-containing layer to said organic layer using a dry etching process.

13. The method of claim 12, further comprising:
    forming an dielectric layer between said organic layer and said substrate; and transferring said feature pattern with said second CD in said organic layer to said dielectric layer using a dry etching process.

14. The method of claim 1, further comprising:

achieving a reduction in CD from said first CD to said second CD of about 10 nanometers (nm) or greater.

15. The method of claim 11, further comprising:

achieving a reduction in CD from said first CD to said second CD of about 10 nanometers (nm) or greater.

* * * * *